(12) United States Patent
Zhang et al.

(10) Patent No.: US 11,362,015 B2
(45) Date of Patent: Jun. 14, 2022

(54) HEAT DISSIPATION STRUCTURE FOR CHIP-ON-FILM, MANUFACTURING METHOD THEREOF, AND DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Ning Zhang, Beijing (CN); Zhihua Sun, Beijing (CN); Shulin Yao, Beijing (CN); Guohuo Su, Beijing (CN); Xu Zhang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 814 days.

(21) Appl. No.: 16/081,197

(22) PCT Filed: Jan. 22, 2018

(86) PCT No.: PCT/CN2018/073620
§ 371 (c)(1),
(2) Date: Aug. 30, 2018

(87) PCT Pub. No.: WO2019/015283
PCT Pub. Date: Jan. 24, 2019

(65) Prior Publication Data
US 2021/0210410 A1 Jul. 8, 2021

(30) Foreign Application Priority Data
Jul. 20, 2017 (CN) .......................... 201710594785.3

(51) Int. Cl.
*H01L 23/427* (2006.01)
*H01L 21/48* (2006.01)
*H01L 23/498* (2006.01)

(52) U.S. Cl.
CPC ........ *H01L 23/427* (2013.01); *H01L 21/4882* (2013.01); *H01L 23/4985* (2013.01)

(58) Field of Classification Search
None
See application file for complete search history.

(56) References Cited

U.S. PATENT DOCUMENTS

2007/0056711 A1* 3/2007 Ohsawa .............. F28D 15/0233
165/104.21
2010/0061109 A1* 3/2010 Hou ...................... F21V 29/763
362/373

(Continued)

FOREIGN PATENT DOCUMENTS

CN 101510533 A 8/2009
CN 203015366 U 6/2013

(Continued)

OTHER PUBLICATIONS

International Search Report in corresponding PCT Application No. PCT/CN2018/073620, dated Apr. 13, 2018 (an English translation attached hereto).

(Continued)

*Primary Examiner* — Evren Seven
(74) *Attorney, Agent, or Firm* — Leason Ellis LLP (57) ABSTRACT

A heat dissipation structure and a manufacturing method thereof and a display device. The heat dissipation structure includes: a heat dissipation plate body, including an evaporation part and a condensation part; a plurality of micro-cavity structures, disposed in the heat dissipation plate body, two ports of each of the micro-cavity structures being sealed, and the micro-cavity structures being filled with liquid. Each (Continued)

of the micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part to achieve heat dissipation.

12 Claims, 5 Drawing Sheets

(56) References Cited

U.S. PATENT DOCUMENTS

| | | |
|---|---|---|
| 2011/0203777 A1 | 8/2011 | Zhao et al. |
| 2012/0305222 A1 | 12/2012 | Yang et al. |
| 2015/0181764 A1* | 6/2015 | Honmura ............ F28D 15/04 165/104.26 |
| 2017/0344165 A1* | 11/2017 | Heo ..................... G06F 3/0447 |

FOREIGN PATENT DOCUMENTS

| | | |
|---|---|---|
| CN | 203279027 U | 11/2013 |
| CN | 204143123 U | 2/2015 |
| CN | 105977229 A | 9/2016 |
| JP | 2005337612 | 12/2005 |
| WO | 2013101428 | 7/2013 |

OTHER PUBLICATIONS

Written Opinion in corresponding PCT Application No. PCT/CN2018/073620, dated Apr. 13, 2018 (an English translation attached hereto).

Extended European Search Report dated Mar. 31, 2021 corresponding to European Patent Application No. 18758531.0; 9 pages.

* cited by examiner

HEAT DISSIPATION STRUCTURE FOR CHIP-ON-FILM, MANUFACTURING METHOD THEREOF, AND DISPLAY DEVICE

CROSS REFERENCE OF RELATED APPLICATIONS

The application is a U.S. National Stage Application under 35 U.S.C. § 371 of International Patent Application No. PCT/CN2018/073620, filed Jan. 22, 2018 which claims priority of the Chinese patent application No. 201710594785.3, filed on Jul. 20, 2017, the entire disclosures of which are incorporated herein by reference in their entireties as part of the present application.

TECHNICAL FIELD

At least one embodiment of the present disclosure relates to a heat dissipation structure for a chip-on-film, a manufacturing method thereof, and a display device.

BACKGROUND

Chip-On-Film (COF) refers to a flexible add-on circuit board that does not package a chip, and a chip for the COF refers to a source driver IC etc. In semiconductor display panels with large-size and large-resolution, the chip for the COF has a high degree of integration. Upon the temperature of the chip for the COF being too high and exceeding the rated operating temperature of the chip in operation, the chip may be unstable or even may be damaged.

SUMMARY

At least one embodiment of the present disclosure provides a heat dissipation structure for a chip-on-film and a manufacturing method thereof, and a display device. The heat dissipation structure applies a two-phase flow heat dissipation technology and a micro-channel heat dissipation technology, and the heat dissipation structure can be applied to a large-size display device to provide a good heat dissipation effect.

At least one embodiment of the disclosure provides a heat dissipation structure for a chip-on-film, including: a heat dissipation plate body, including an evaporation part and a condensation part; a plurality of micro-cavity structures, disposed in the heat dissipation plate body. Two ports of each of the plurality of micro-cavity structures are sealed, and the plurality of micro-cavity structures are filled with liquid. Each of the plurality of micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part to achieve heat dissipation.

For example, in some examples, the heat dissipation structure has a U-shaped or L-shaped cross section along an extending direction of the plurality of micro-cavity structures.

For example, in some examples, a maximum size of a cross section of each of the plurality of micro-cavity structures in a plane perpendicular to an extending direction of the plurality of micro-cavity structures is 10 μm-2 mm.

For example, in some examples, the plurality of micro-cavity structures are arranged in parallel to each other.

For example, in some examples, a surface of the evaporation part is provided with a concave part.

For example, in some examples, a thermal conductivity of the condensation part is higher than that of the evaporation part.

For example, in some examples, the heat dissipation plate body includes a first substrate and a second substrate, and the first substrate and the second substrate are attached and sealed to each other, so that the plurality of micro-cavity structures are formed between the first substrate and the second substrate.

For example, in some examples, the plurality of micro-cavity structures are in communication with each other.

For example, in some examples, a region of the plurality of micro-cavity structures which is not filled with the liquid includes a negative pressure region.

For example, in some examples, the liquid includes one of or a mixture of more than one selected from the group consisting of water, ethanol, acetone, and a solvent containing nano-particles.

At least one embodiment of the present disclosure provides a display device including: a chip-on-film, including a chip; and the heat dissipation structure provided by any one embodiment of the disclosure. The heat dissipation structure is attached to the chip-on-film, and an orthographic projection of the chip on the heat dissipation structure falls into the evaporation part.

For example, in some examples, the heat dissipation structure is attached to a side of the chip-on-film facing away from the chip.

For example, in some examples, one side of the heat dissipation structure is provided with a concave part, and the side of the heat dissipation structure provided with the concave part is attached to the side of the chip-on-film provided with the chip, and the chip is in the concave part.

For example, in some examples, a thermal silicone grease is provided between the heat dissipation structure and the chip-on-film.

At least one embodiment of the present disclosure provides a method of manufacturing the above mentioned heat dissipation structure, including: forming the heat dissipation plate body having the plurality of micro-cavity structures; filling the plurality of micro-cavity structures with the liquid. The heat dissipation plate body includes the evaporation part and the condensation part, each of the plurality of micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part to achieve heat dissipation.

For example, in some examples, the heat dissipation plate body includes a first substrate and a second substrate, and forming the heat dissipation plate body having the plurality of micro-cavity structures includes: forming a plurality of first grooves in the first substrate; forming a plurality of second grooves in the second substrate; attaching a side of the first substrate provided with the first grooves to a side of the second substrate provided with the second grooves to form the heat dissipation plate body having the plurality of micro-cavity structures. An orthographic projection of the plurality of first grooves on the second substrate completely coincides with an orthographic projection of the plurality of second grooves on the second substrate, so that the plurality of first grooves are bonded to the plurality of second grooves in one-to-one correspondence to form the plurality of micro-cavity structures.

For example, in some examples, forming the heat dissipation plate body having the plurality of micro-cavity structures includes: providing a substrate; presetting a center line on the substrate, and symmetrically processing both sides of the center line to form a plurality of grooves symmetrically distributed on the both sides of the center line; folding the substrate along the center line to form the heat dissipation plate body having the plurality of micro-cavity structures. The substrate is folded along the center line to bond the plurality of grooves completely to form the plurality of micro-cavity structures.

For example, in some examples, the method of manufacturing the heat dissipation structure further includes: processing the heat dissipating structure so that the heat dissipation structure has a U-shaped or L-shaped cross section along an extending direction of the plurality of micro-cavity structures.

For example, in some examples, the heat dissipation plate body having the plurality of micro-cavity structures is formed by using a 3D printing technique.

For example, in some examples, after forming the plurality of micro-cavity structures, sealing periphery edges of the heat dissipation plate body, and in the sealing, at least one unsealed region is retained at an edge where the plurality of micro-cavity structures extend to the heat dissipation plate body so as to fill the plurality of micro-cavity structures with the liquid, and sealing the unsealed region after filling the liquid.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. "On," "under," "right," "left" and the like are only used to indicate relative position relationship, and when the position of the object which is described is changed, the relative position relationship may be changed accordingly.

In the study, the inventors of the present application found that, after the semiconductor display panel starts to operate, the chip for the chip-on-film (COF) in the display device starts to generate heat, and the temperature of the chip for the COF gradually rises. Upon the temperature of the chip for the COF rising to a certain level, a problem that the operating performance of the COF circuit substrate is unstable may occur. In a large-size semiconductor display panel, as the screen size and resolution increase, the amount of data processed and transmitted by the chip for the COF is further increased, which further increases the temperature of the chip for the COF. In addition, the form of the COF of the display device is generally U-shape, so that the heat dissipation of the chip for the COF has a crucial problem to solve.

The heat dissipation plate generally used for the heat dissipation of the chip for the COF mostly has a solid structure, so it is difficult to effectively dissipate the heat of the chip for the COF in large-size display devices.

In addition to using the heat dissipation plate to dissipate the heat of the chip for the COF, a water cooling method can also be used, that is, a micro water pump is used to make liquid flow in a closed circulating water pipe, and the heat is taken away upon the liquid passing near the chip, so that the temperature of the chip can be greatly reduced. The water cooling method is ideal for cooling a single chip. For example, some high-end gaming laptops and desktops use the water cooling method to reduce the temperature of the Central Processing Unit (CPU). However, on the one hand, the circulating water cooling device is too bulky, which affects the lightness and thickness of the product; on the other hand, there is a lot of liquid working fluid in the circulating water cooling device, and in a case that the aging and cracking of the pipeline, etc. occur, the liquid is completely leaked, which easily leads to a case that the integration circuit is short-circuited or even burned, and thus has hidden trouble in safety. Because the semiconductor display panel trends to have a large size and a thin thickness, such a water cooling device is not suitable for solving the heat dissipation problem of the chip for the COF.

Embodiments of the present disclosure provide a heat dissipation structure for a chip-on-film and a manufacturing method thereof, and a display device. The heat dissipation structure for the chip-on-film includes: a heat dissipation plate body, including an evaporation part and a condensation part; a plurality of micro-cavity structures, disposed in the heat dissipation plate body. Two ports of each of the micro-cavity structures are sealed, and the micro-cavity structure are filled with liquid. Each of the micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part by a capillary force provided by the micro-channel structure to achieve the heat dissipation. The heat dissipation structure provided by the embodiment of the present disclosure applies a two-phase flow heat dissipation technology and a micro-channel heat dissipation technology, and the heat dissipation structure can be applied to a large-size display device to provide a good heat dissipation effect.

The heat dissipation structure for the chip-on-film and the manufacturing method thereof and the display device provided by the embodiments of the present disclosure are described below with reference to the accompanying drawings.

Figure 1A:
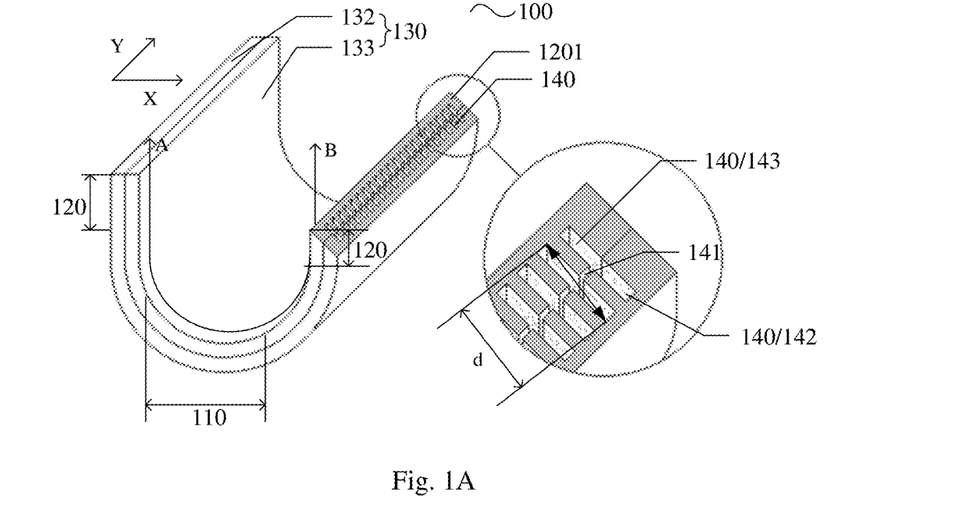
FIG. 1A is a partial cutting view of a heat dissipation structure according to an example of an embodiment of the present disclosure.
Figure 1B:
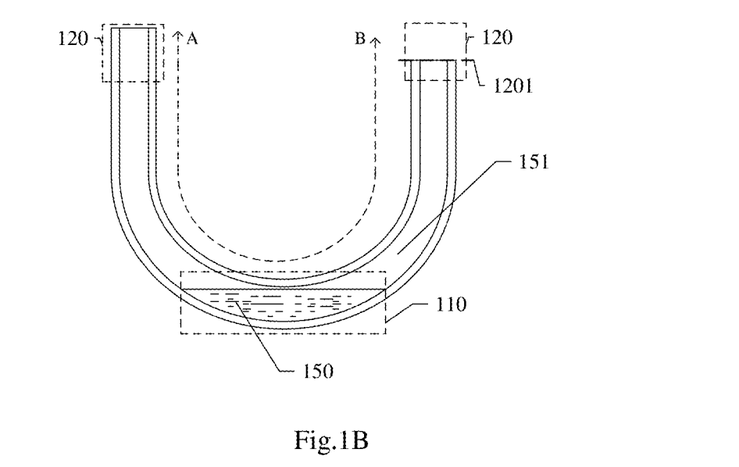
FIG. 1B is a cross-sectional view of the heat dissipation structure shown in FIG. 1A along line AB.

An embodiment of the present disclosure provides a heat dissipation structure for a chip-on-film. FIG. 1A is a partial cutting view of a heat dissipation structure according to an example of the present disclosure, and FIG. 1B is a cross-sectional view of the heat dissipation structure shown in FIG. 1A along line AB. As shown in FIGS. 1A and 1B, the heat dissipation structure 100 for the chip-on-film includes: a heat dissipation plate body 130 including an evaporation part 110 and a condensation part 120; and a plurality of micro-cavity structures 140 disposed in the heat dissipation plate body 130. Two ports of each of the micro-cavity structures 140 in the heat dissipation plate body 130 are sealed and the micro-cavity structures 140 are filled with liquid 150, and the liquid 150 is not completely filled up the micro-cavity structures 140. Each of the micro-cavity structures 140 of the heat dissipation structure 100 extends from the evaporation part 110 to the condensation part 120, and the evaporation part 110 is filled with the liquid 150 which absorbs the heat of the heat source close to the evaporation part 110 (for example, the chip for the chip-on-film), and then changes to vapor. The vapor moves toward the condensation part 120 in the micro-cavity structures 140. The vapor moved to the condensation part 120 is condensed and liquefied and moves toward the evaporation part 110 by means of the capillary force provided by the micro-cavity structures 140 (for example, the micro-channel structures). After the liquid 150 moves to the evaporation part 110, it continues to absorb heat to evaporate so as to implement a phase change cycle, thereby achieving a heat dissipation effect which rapidly transfers the heat.

It should be noted that, FIGS. 1A and 1B are schematic diagrams showing that the condensation part 120 on the right side of the heat dissipation structure 100 is partially cut. In the partial cutting diagram, the plane 1201 perpendicular to an extending direction AB of the micro-cavity structure 140 can clearly illustrate the cross-sectional shape of the internal micro-cavity structure 140 of the heat dissipation structure 100. Here, an example in which the cross section of the micro-cavity structure 140 is a rectangular shape is illustrated, but it is not limited thereto. For example, it can be a circular shape, a polygonal shape, or an irregular shape. In addition, the shape of the condensation part 120 on the right side of the heat dissipation structure 100 should be the same as the left side, that is, the heat dissipation structure has a closed state.

It should be noted that, the "phase change cycle" herein refers to the evaporation-condensation cycle of the two-phase flow heat dissipation technology, which uses the liquid to absorb heat at the evaporation part close to the heat source, the liquid changes to vapor, and then the vapor condenses and dissipates heat at the condensation part to rapidly conduct the heat. Furthermore, the thermal conductivity efficiency of the technology is higher than that of a general solid material.

For example, the "micro-cavity structure" of the present embodiment can refer to a micro-channel. The heat dissipation structure 100 is provided with a micro-cavity structure 140. The tiny space of the micro-cavity structure 140 can provide a capillary pulling force for the liquid 150, and the capillary pulling force can facilitate to pull back the liquid condensed in the cavity from the condensation part 120 to the evaporation part 110 close to the heat source in time, thereby resisting the thrust of the vapor pressure in the micro-cavity structure 140, to prevent the evaporation part 110 from continuously drying in a large area, so as to improve performance and efficiency of the heat dissipation structure 100. Therefore, the heat dissipation structure provided by the embodiment of the present disclosure applies the two-phase flow heat dissipation technology and micro-channel heat dissipation technology to provide a good heat dissipation effect.

For example, the "micro-cavity structure" of the present embodiment can also refer to a wire mesh or a sintered structure or the like, and the cross-sectional shape of these structures can be a regular shape or an irregular shape. These structures are also capable of providing the capillary pulling force to the liquid condensed in the cavity so that the condensed liquid can flow back from the condensation part to the evaporation part in time.

For example, as shown in FIGS. 1A and 1B, the heat dissipation structure 100 has a U-shaped cross section along the extending direction of the micro-cavity structure 140, that is, the cross section of the heat dissipation structure 100 along the line AB is the U-shape. The "U" shape here includes a standard U-shape and an approximate U-shape.

Figure 1C:
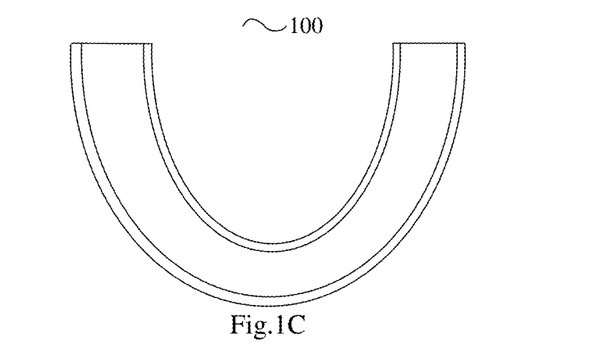
FIG. 1C is a cross-sectional view of a heat dissipation structure according to an example of an embodiment of the present disclosure.
Figure 1D:
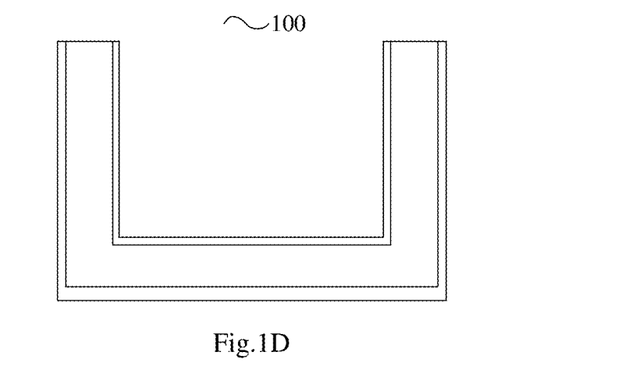
FIG. 1D is a cross-sectional view of a heat dissipation structure according to an example of an embodiment of the present disclosure.

FIGS. 1C and 1D are schematic cross-sectional views of the heat dissipation structure 100 along the line AB of FIG. 1A according to some examples of the present disclosure, and the cross section of the heat dissipation structure 100 illustrated in FIGS. 1C and 1D has an approximate U-shape. For example, it can be an approximate U-shape similar to a para-curve, as shown in FIG. 1C, or an approximate U-shape consist of straight lines, as shown in FIG. 1D.

Upon the heat dissipation structure 100 being used for dissipating heat of the chip for the COF in a large-size display device, on the one hand, because the form of the COF of the display device is often "U" shape, that is, the COF has a U-shaped cross section, the heat dissipation structure having the U shape can better support the COF. On the other hand, because the chip for the COF is disposed at a bent part of the COF (the U-shaped COF bent part), the evaporation part 110 provided by the present example is disposed at the bent part of the U-shaped heat dissipation structure 100 (U-shaped cross section), which can facilitate the gather of the liquid in the bent part and make the liquid close to the chip for the COF, so that the U-shaped heat dissipation structure 100 can provide a better heat dissipation effect.

For example, as shown in FIGS. 1A and 1B, the condensation part 120 is disposed at an end of the U-shaped heat dissipation structure 100 (U-shaped cross section), that is, the U-shaped heat dissipation structure 100 includes two ends, and the micro-cavity structure 140 can extend from the bent part of the heat dissipation structure 100 to at least one end of the heat dissipation structure 100.

For example, the micro-cavity structure 140 can extend from the bent part to one end of the U-shaped heat dissipation structure 100 to form an approximate L-shaped (or J-shaped) cross section.

For example, the micro-cavity structure 140 can also extend from the bent part to both ends of the U-shaped heat dissipation structure 100 to form a U-shaped cross section. In the present embodiment, an example in which the condensation part 120 is disposed at both ends of the U-shaped heat dissipation structure 100 is illustrated.

For example, as shown in FIG. 1A, a plurality of micro-cavity structures 140 provided by the present embodiment are provided in parallel to each other, that is, each of the micro-cavity structures 140 is sequentially arranged in parallel in a direction (Y direction) perpendicular to a plane in which the micro-cavity structure 140 extends. In the present embodiment, an example in which the plurality of micro-cavity structures 140 of the heat dissipation structure are provided in parallel is illustrated. On the one hand, uniform heat dissipation can be ensured, and on the other hand, in the case where the size of the heat dissipation structure 100 is constant, the evaporation part 110 can be filled with more liquid 150 to achieve an optimum heat dissipation effect. The present embodiment includes it but is not limited thereto, and for example, the plurality of micro-cavity structures can also be provided in non-parallel.

For example, as shown in FIGS. 1A and 1B, a maximum size d of the cross section of each of the micro-cavity structures 140 in a plane perpendicular to the extending direction of the micro-cavity structures 140 (for example, the plane 1201) is 10 μm-2 mm.

For example, as shown in FIGS. 1A and 1B, in the embodiment, an example in which the cross section of the micro-cavity structure 140 in a plane 1201 perpendicular to the extending direction of the micro-cavity structure 140 is a rectangular is illustrated, and the maximum size d is a diagonal size of the rectangular. The embodiment is not limited thereto. For example, in a case that the cross section of the micro-cavity structure 140 in a plane perpendicular to the extending direction of the micro-cavity structure 140 is a circular, the maximum size d is the diameter of the circular; alternatively, in a case that the cross section of the micro-cavity structure 140 in the plane perpendicular to the extending direction of the micro-cavity structure 140 is an irregular shape, the maximum size d is the largest size of the irregular shape in each direction.

For example, in the direction perpendicular to the plane in which the micro-cavity structure 140 extends (for example, a U-shaped or approximate U-shaped cross section), that is, in the Y direction, the maximum size of each of the micro-cavity structures 140 is 10 μm-1 mm. The embodiment includes this but is not limited thereto. In a case that the cross-sectional shape of each of the micro-cavity structures 140 is a rectangle as shown in FIG. 1A, each of the micro-cavity structures 140 has a size of 10 μm-1 mm in the Y direction, that is, in the Y direction, the side length of the rectangle is 10 μm-1 mm; in a case that the cross-sectional shape of each of the micro-cavity structures 140 is a circular, a polygonal or an irregular, the maximum size of each of the micro-cavity structures 140 in the Y direction is 10 μm-1 mm, and in the Y direction, a minimum size of each of the micro-cavity structures 140 can be in a range of 10 μm-1 mm or less than 10 μm. In the embodiment, the example in which the cross section of the end of the micro-cavity structure 140 is a rectangular. The embodiment includes this but is not limited thereto. In a case that the micro-cavity structures have a mesh structure or a sintered structure, each opening of the mesh structure or the sintered structure has a maximum size of 10 μm-1 mm in the Y direction.

For example, as shown in FIG. 1A, in a case that the cross section of the micro-cavity structure 140 in a plane perpendicular to the extending direction of the micro-cavity structure 140 is a rectangular, the maximum size of the micro-cavity structure 140 in the X direction is 0.1 mm-2 mm That is, the side length of the rectangular cross section of the micro-cavity structure 140 in the X direction is 0.1 mm-2 mm, and the embodiment includes this but is not limited thereto. The micro-cavity structure provided by the present embodiment has a very small aperture diameter, and thus a capillary pulling force can be provided for the condensed liquid in the cavity to enable the condensed liquid to flow from the condensation part back to the evaporation part in time.

For example, as shown in FIGS. 1A and 1B, the plurality of micro-cavity structures 140 are in communication with each other, that is, adjacent micro-cavity structures 140 are in communication with each other. In the present embodiment, an example in which the adjacent micro-cavity structures 140 are in communication by a narrow channel 141 having the same extending direction as the micro-cavity structure 140 is illustrated. In the present embodiment, the maximum size of the cross section of each of the micro-cavity structures 140 in a plane perpendicular to the extending direction of the micro-cavity structures 140 does not take into account the size of the narrow channel 141. The embodiment includes this but is not limited thereto. For example, adjacent micro-cavity structures 140 can also be in communication by through pores or the like. The plurality of micro-cavity structures of the present embodiment are in communication with each other, so that the liquid filled in the evaporation part can be distributed more uniform, and the evaporated liquid contacts with the condensation part more uniform to achieve a better heat dissipation effect.

For example, as shown in FIG. 1A, the heat dissipation plate body 130 includes a first substrate 132 and a second substrate 133. The first substrate 132 and the second substrate 133 are attached and sealed to each other, so that the plurality of micro-cavity structures 140 are formed between the first substrate 132 and the second substrate 133.

For example, a thickness of the first substrate 132 (the second substrate 133) can be 0.2 mm-2 mm, and a thickness of the heat dissipation plate body formed by attaching the first substrate to the second substrate can be 0.5 mm-5 mm. The embodiment includes this but is not limited thereto.

For example, the first substrate 132 is provided with a plurality of first grooves, and the second substrate 133 is provided with a plurality of second grooves. A side of the first substrate 132 provided with the first grooves and a side of the second substrate 133 provided with the second grooves are attached and sealed, and an orthographic projection of the plurality of first grooves on the second substrate 133 coincides with the plurality of second grooves, so that the plurality of first grooves and the plurality of second grooves are bonded in one-to-one correspondence to form the plurality of micro-cavity structures 140.

For example, the first grooves and the second grooves do not run through the first substrate 132 and the second substrate 133 in the extending direction thereof. The periphery edges of the first substrate and the second substrate in the present example are sealed to ensure that two ports of each of the micro-cavity structures are sealed to prevent the liquid from flowing out of the micro-cavity structures.

The present embodiment includes this but is not limited thereto. For example, the first groove (second groove) provided in the first substrate 132 (the second substrate 133) runs through the first substrate 132 (the second substrate 133) in at least one direction of the extending direction thereof, so that the micro-cavity structure 140 runs through the heat dissipation plate body 130 in the at least one direction of the extending direction.

For example, the ports of the micro-cavity structures 140 running through the heat dissipation plate body 130 are sealed. For example, the material of the first substrate 132 (the second substrate 133) has the same material, and a material having thermal conductivity higher than the thermal conductivity of the first substrate 132 (the second substrate 133) is provided at the port of the micro-cavity structure 140 that runs through the heat dissipation plate body 130 as the condensation part 120 of the heat dissipation structure 100. That is, the thermal conductivity of the condensation part 120 of the heat dissipation structure 100 provided by the present embodiment is higher than that of the evaporation part 110 to achieve a better condensation effect, and the present embodiment is not limited thereto.

For example, the material provided on the port of the micro-cavity structure 140 running through the heat dissipation plate body 130 can be copper having a higher thermal conductivity, and the first substrate 132 (the second substrate 133) may be made of aluminum having a lower thermal conductivity than the thermal conductivity of the copper, so that the heat dissipation structure has a better heat dissipation effect.

For example, in the present example, the first substrate (and/or the second substrate) can include two materials, for example, the condensation part can be made of copper having a higher thermal conductivity, and the evaporation part can be made of aluminum having a lower thermal conductivity, in order to achieve a better heat dissipation effect of the heat dissipation structure.

For example, the material of the heat dissipation plate body 130 (including the condensation part and the evaporation part) can be the same material. For example, the material can include copper, aluminum, graphite, or ceramics or the like which is advantageous for heat dissipation. For example, in order to achieve a better evaporation and condensation effect, the condensation part 120 of the heat dissipation plate body 130 can be doped with a material having better heat dissipation property, and the present embodiment includes this but is not limited thereto.

For example, the heat dissipation plate body can also include only one substrate. A center line may be provided on the substrate, and then both sides of the center line are processed to form symmetrically distributed grooves, and then the substrate is folded along the center line to ensure that the grooves are completely bonded to form the plurality of micro-cavity structures.

For example, as shown in FIGS. 1A and 1B, a region of the micro-cavity structure 140 that is not filled with the liquid 150 includes a negative pressure region 151, that is, the gas pressure of the region of the micro-cavity structure 140 that is not filled with the liquid 150 is lower than the standard atmospheric pressure to prevent explosion of the micro-cavity structures 140 due to volume expansion in a case that the liquid 150 absorbs heat and vaporizes at the evaporation part 110.

For example, the liquid 150 includes one of or a mixture of more than one selected from the group consisting of water, ethanol, acetone, and a solvent containing nanoparticles, and the like. The present embodiment includes this, but is not limited thereto, as long as the liquid can be evaporated by heating and be condensed by cooling. For example, the nanoparticles can be carbon nanotubes or the like, and the solvent containing the nanoparticles can be water, ethanol or acetone.

Figure 2:
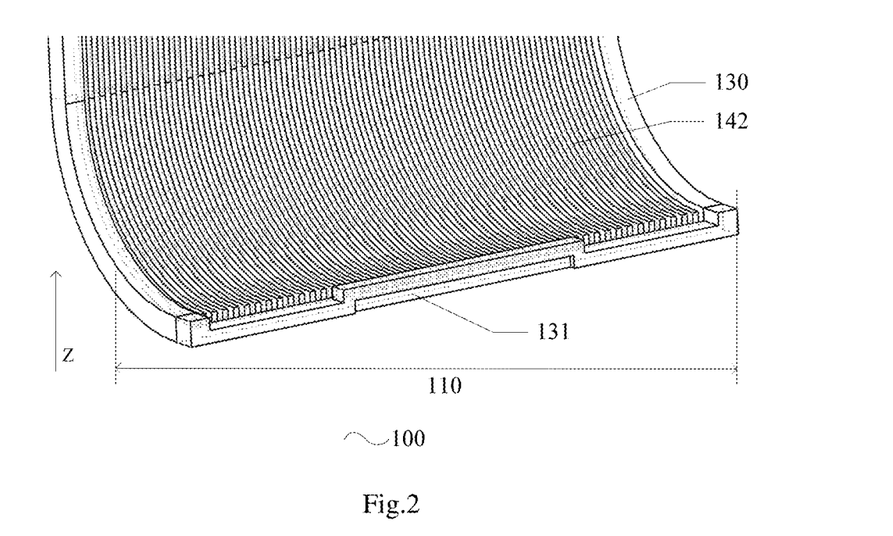
FIG. 2 is a partial schematic view of an internal structure of the heat dissipation structure shown in FIG. 1A.

For example, FIG. 2 is a partial schematic view showing an internal structure of the heat dissipation structure shown in FIG. 1A. For example, FIG. 2 can be a partial schematic view of the first substrate 132 of FIG. 1A provided with the first grooves. It should be noted that, the first grooves 142 of FIG. 2 are a portion of the micro-cavity structures 140. As shown in FIG. 2, a surface of the evaporation part 110 is provided with a concave part 131 for wrapping a heat source such as the chip for the COF. That is, the heat source can be disposed in the concave part 131. Therefore, the shape and size of the concave part 131 can be designed according to the shape and size of the heat source.

For example, the concave part 131 can be disposed in one of the upper and lower surfaces of the evaporation part 110 in the Z direction. FIG. 2 illustrates an example in which the concave part 131 is disposed in the lower surface of the evaporation part 110, that is, an opening of the concave part 131 faces away from the condensation part, but it is not limited thereto.

For example, the concave part 131 can also be disposed in the upper surface of the evaporation part 110, that is, the opening of the concave part 131 faces the condensation part. For example, a depth of the concave part 131 in the Z direction can be 0.5-1 mm, and the present embodiment includes this, but is not limited thereto.

It should be noted that, in a case that the thickness of the heat source in the Z direction is less than the thickness of the bent part of the heat dissipation plate body 130 (the solid part of the micro-cavity structure facing the heat source) in the Z direction, the design of the micro-cavity structure would not be influenced; in a case that the thickness of the heat source in the Z direction is not less than the thickness of the bent part of the heat dissipation plate body 130 (the solid part of the micro-cavity structure facing the heat source) in the Z direction, in order to prevent leakage of the liquid in the micro-cavity structures, the heat dissipation plate body 130 is not provided with any micro-cavity structure at the concave part 131, and the present embodiment includes this, but is not limited thereto.

Figure 3:
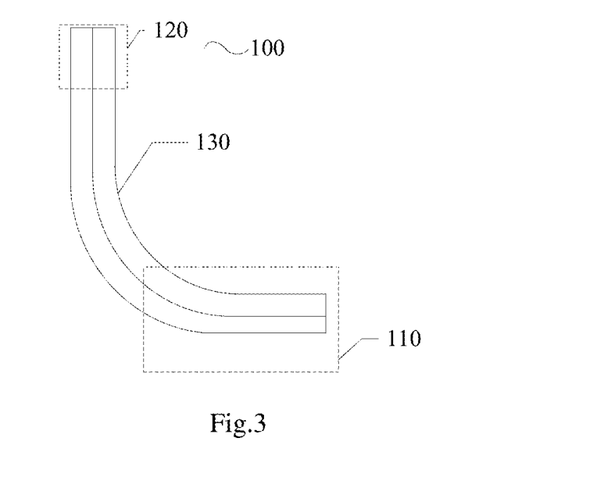
FIG. 3 is a schematic structural diagram of a heat dissipation structure according to another example of an embodiment of the present disclosure.

For example, FIG. 3 is a schematic structural diagram of a heat dissipation structure according to another example of an embodiment of the present disclosure. As shown in FIG. 3, a cross section of the heat dissipation structure 100 along an extending direction of the micro-cavity structures (not shown) is L-shape. The "L" shape herein includes a standard L-shape and an approximate L-shape or a J-shape, and FIG. 3 shows an approximate L-shape. Because the chip for the COF is disposed at the bent part of the COF, in a case that the heat dissipation structure 100 provided by the present example is used to dissipate heat of the chip for the COF, the evaporation part 110 is disposed at one end of the L-shaped cross section close to the heat source (the chip for the COF), that is, close to the position of the chip for the COF, which can have a better heat dissipation effect. The present embodiment is not limited thereto, and the evaporation part of the heat dissipation plate body can also be disposed at other positions, as long as it can dissipate the heat of the heat source.

For example, as shown in FIG. 3, the condensation part 120 is disposed at one end of the L-shaped heat dissipation structure (L-shaped cross section) 100 far away from the heat source, that is, the micro-cavity structures can extend from the end of the L-shaped heat dissipation structure 100 close to the heat source to the end of the L-shaped heat dissipation structure 100 far away from the heat source. The heat dissipation structure provided by the present example has the same features as the heat dissipation structure shown in FIG. 1A except for the shape, and details will not be repeated herein.

Figure 4A:
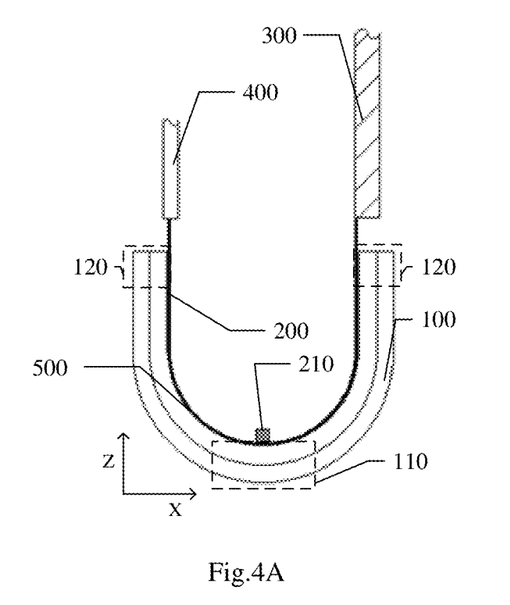
FIG. 4A is a partial structural diagram of a display device according to an example of an embodiment of the present disclosure.

Another embodiment of the present disclosure provides a display device. FIG. 4A is a partial schematic structural diagram of a display device according to an embodiment of the present disclosure. As shown in FIG. 4A, the display device includes a chip-on-film (COF) and the heat dissipation structure 100 of any of the above embodiments. Here, an example in which the cross section of the chip-on-film 200 has a U-shape, that is, the cross section in the XZ plane as shown is U-shape, and the cross section of the heat dissipating structure 100 along the extending direction of the micro-cavity structure is U-shape, is illustrated. That is, the example in which the cross section of the XZ plane as shown is U-shape is illustrated. The U-shaped heat dissipation structure 100 can provide better support for the chip-on-film 200. The chip-on-film 200 includes a chip 210 which is disposed on an inner side of the bent part of the U-shaped chip-on-film 200 (as shown in FIG. 4A). As shown in FIG. 4A, the heat dissipation structure 100 is attached to the chip-on-film 200, and an orthographic projection of the chip 210 on the heat dissipation structure 100 falls into the evaporation part 110. In the present embodiment, an example in which the heat dissipation structure 100 is attached to a side of the chip-on-film 200 facing away from the chip 210 is illustrated. It should be noted that, the shape of the heat dissipation structure can also be an approximate L-shape, as shown in FIG. 3, and the manner of attaching to the chip-on-film and the heat dissipation principle of the L-shaped heat dissipation structure are similar to those of the U-shaped heat dissipation structure, and will not be repeated herein.

For example, the chip can also be disposed on an outer side of the bent part of the U-shaped chip-on-film, and the heat dissipation structure can be attached to a side of the chip-on-film facing away from the chip, that is, the heat dissipation structure is attached to the inner side of the chip-on-film; the heat dissipation structure can also be attached to the side of the chip-on-film facing the chip, that is, the heat dissipating structure is attached to the outer side of the chip-on-film (the side on which the chip is disposed), and in this case, the surface of the evaporation part should be provided with a concave part to wrap the chip (not shown).

For example, as shown in FIG. 4A, the display device further includes a display panel 300 connected to one end of the chip-on-film 200, and a timing control (TCON) circuit board 400 or a source circuit board 400 connected to the other end of the chip-on-film 200.

For example, after the display panel 300 starts to operate, the chip 210 for the COF starts to generate heat, and the temperature of the chip for the COF 210 gradually increases. As the temperature of the chip 210 increases, the liquid in the evaporation part 110 of the heat dissipation plate body close to the chip 210 (the U-shaped bent part) absorbs heat and evaporates. Meanwhile, the vapor pressure of the evaporation part 110 increases, and the vapor rapidly moves to the condensation part 120 (at least one end of the U-shaped heat dissipation structure 100) under the vapor pressure. In the present embodiment, an example in which the condensation part 120 is disposed at both ends of the U-shaped heat dissipation structure 100 is illustrated, but it is not limited thereto. In a case that the vapor with high temperature moves to the condensation part 120 with low temperature, the heat of the vapor is released and the vapor is condensed into the liquid, and the liquid just condensed at the condensation part 120 is pulled back to the evaporation part 110 by the gravity of the condensed liquid and the capillary pulling force of the micro-cavity structures, and then, the liquid absorbs heat at the evaporation part 110 again to produce a phase change, so as to form a complete evaporation-condensation cycle, that is, the heat absorption and release cycle. Such a phase change cycle can continuously remove the heat of the chip 210 to achieve the effect of cooling the chip 210.

Figure 4B:
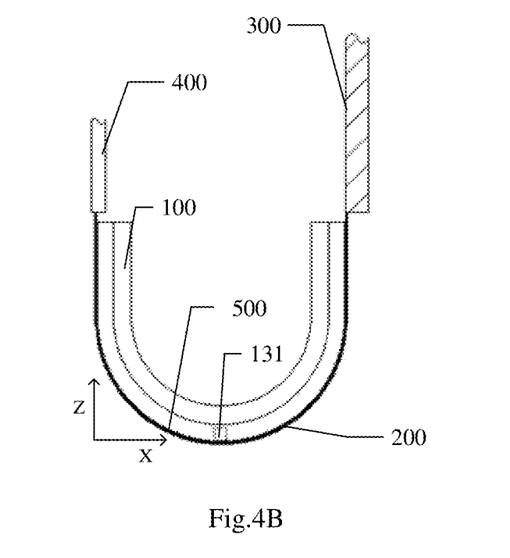
FIG. 4B is a partial structural diagram of a display device according to another example of an embodiment of the present disclosure.

For example, FIG. 4B is a partial structural diagram of a display device according to another example of an embodiment of the present disclosure. As shown in FIG. 4B, FIG. 4B is different from FIG. 4A in that one side of the heat dissipation structure 100 is provided with a concave part 131, and the side of the heat dissipation structure provided with the concave part 131 is attached to the side of the chip-on-film 200 provided with the chip 210, and the chip 210 is in the concave part 131. That is, in a case that the U-shaped heat dissipation structure 100 is attached to the side of the chip-on-film 200 provided with the chip 210, because the chip 210 generally protrudes by about 0.5-1 mm from the surface of the chip-on-film 200, the concave part 131 is formed on the surface of the evaporation part 110. The shape and size of the concave part 131 are determined by the shape and size of the chip 210. For example, the thickness of the concave part 131 in the Z direction can be 0.5-1 mm, and the chip 210 is in the concave part 131 so as to better wrap the chip 210. The purpose of providing the concave part in the example is to increase the heat transfer contact area and protect the chip in terms of the mechanical structure.

For example, as shown in FIGS. 4A and 4B, a thermal silicone grease 500 is provided between the heat dissipation structure 100 and the chip-on-film 200. That is, whether the heat dissipation structure 100 is attached to the side of the chip-on-film 200 provided with the chip 210 or the side of the chip-on-film 200 facing away from the chip 210, the thermal silicone grease 500 (i.e. the heat interface material) is provided between the heat dissipation structure 100 and the chip-on-film 200, which can conduct the heat radiated from the chip for the chip-on-film 20 to the heat dissipation structure 100, so that the temperature of the chip 210 can keep at a level at which it can work stably, so as to prevent the chip 210 from being damaged due to poor heat dissipation and prolong its service life.

For example, the thermal silicone grease is also called thermal grease. The thermal grease is made of organic silicone as a main raw material, and is added a material having excellent heat resistance and thermal conductivity to form thermal conductive silicone grease composite. The thermal silicone grease is a high heat conductive and insulation silicone material which almost cannot be cured. The thermal silicone grease can maintain a long-lasting grease state at temperatures between −50° C. and 230° C., and has excellent electrical insulation and excellent heat conduction properties.

The heat dissipation structure of the display device provided by the present embodiment applies the two-phase flow heat dissipation technology and the micro-channel heat dissipation technology to achieve the technical effect of dissipating heat of the chip for the chip-on-film to reduce the temperature of the chip for the chip-on-film, thereby solving the problem of excessive heat and high temperature of the chip for the chip-on-film in the large-size display device.

For example, the display device can be a display device such as a liquid crystal display device, an organic light-emitting diode (OLED) display device and the like, and any products or components having displaying function and including the display device, such as a television, a digital camera, a mobile phone, a watch, a tablet computer, a notebook computer, and a navigation device. The embodiment is not limited thereto.

Figure 5:
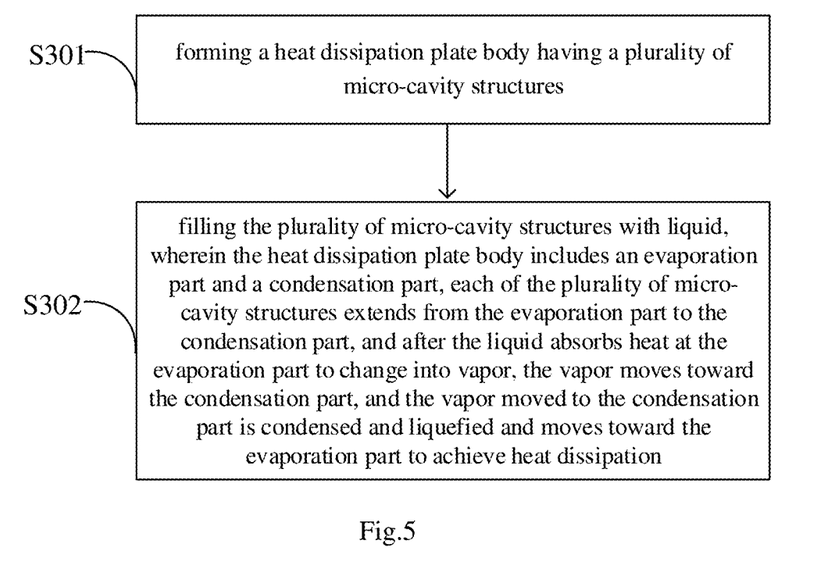
FIG. 5 is a schematic flow chart of a method of manufacturing a heat dissipation structure according to an embodiment of the present disclosure.

Another embodiment of the present disclosure provides a method of manufacturing a heat dissipation structure. FIG. 5 is a schematic flowchart of a method of manufacturing a heat dissipation structure according to an embodiment of the present disclosure. As shown in FIG. 5, the method includes the following steps.

S301: forming a heat dissipation plate body having a plurality of micro-cavity structures;

S302: filling the plurality of micro-cavity structures with liquid, wherein the heat dissipation plate body includes an evaporation part and a condensation part, each of the plurality of micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part to achieve heat dissipation.

Figure 6A:
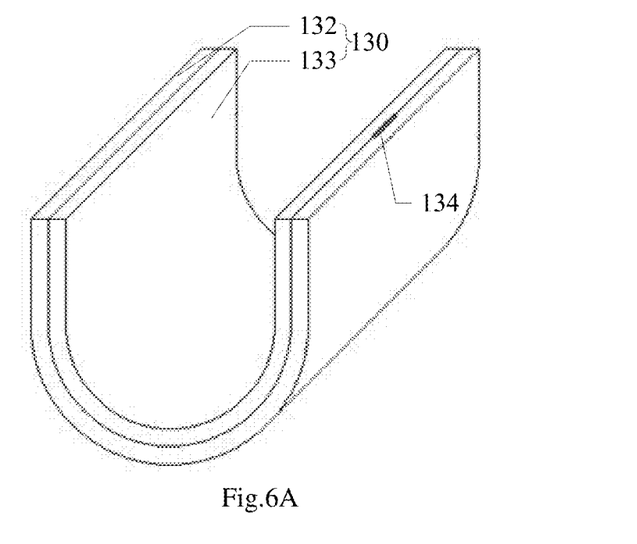
FIG. 6A is a schematic diagram of a heat dissipation structure in a manufacturing process according to an example of an embodiment of the present disclosure.

For example, FIG. 6A is a schematic diagram of a heat dissipation structure in a manufacturing process according to an example of an embodiment of the present disclosure. As shown in FIG. 6A, the heat dissipation plate body 130 includes a first substrate 132 and a second substrate 133. A plurality of first grooves (such as the first groove 142 shown in FIG. 2) are formed in the first substrate 132. For example, the plurality of first grooves are grooves arranged in parallel, and the first grooves do not run through the first substrate 132 in the extending direction of the grooves (the first grooves as shown in FIG. 1A). A plurality of second grooves (such as the second groove 143 shown in FIG. 1A) are formed in the second substrate 133. For example, the plurality of second grooves are grooves arranged in parallel, and the second grooves do not run through the second substrate 133 in the extending direction of the grooves. A side of the first substrate 132 provided with the first grooves is attached to a side of the second substrate 133 provided with the second grooves, and an orthographic projection of the plurality of first grooves on the second substrate 133 coincides with the plurality of second grooves, so that the plurality of first grooves are bonded to the plurality of second grooves in one-to-one correspondence to form the plurality of micro-cavity structures. Then, the periphery edges of the first substrate 132 and the second substrate 133 are welded and sealed, and at least one non-welded area is retained at the edge during welding. For example, an example in which an opening 134 (i.e. the non-closed area 134) is illustrated, but it is not limited thereto, and it is also possible to have a plurality of openings. The openings 134 can be used for subsequent filling the liquid.

For example, upon the heat dissipation structure being filled from the opening 134, a certain amount of the liquid can be pressed into the micro-cavity structures of the heat dissipation structure from the opening 134 by using a vacuum device, and finally the opening is sealed by welding and sintering, or is blocked by heat resistance, to form a completely enclosed U-shaped heat dissipation plate structure containing a quantity of the liquid.

For example, in the liquid filling period, different strengths of negative pressure can be selected to change the liquid filling rate to the heat dissipation structure so that the micro-channel structure includes the liquid and the negative pressure region.

For example, the liquid filled in the heat dissipation structure is distributed in the bent part of the U-shaped heat dissipation structure due to the gravity of the liquid, and the unfilled region in the micro-cavity structure includes the negative pressure region. That is, the air pressure in the region of the micro-cavity structure that is not filled with liquid is lower than the standard atmospheric pressure, to prevent explosion of the micro-cavity structures due to volume expansion in a case that the liquid absorbs heat and vaporizes at the evaporation part.

For example, the liquid includes one of or a mixture of more than one selected from the group consisting of water, ethanol, acetone, and solvent containing nanoparticles, and the like. The embodiment includes this, but is not limited thereto, as long as the liquid can be evaporated by heating and be condensed by cooling.

For example, the first grooves (the second grooves) can also run through the first substrate 132 (the second substrate 133) in the extending direction of the grooves. Because the formed micro-cavity structures have a capillary phenomenon, the heat dissipation plate body with the formed micro-cavity structures can be placed in the liquid to inhale a certain amount of the liquid, and after that the micro-cavity structures are sealed. Alternatively, a certain amount of the liquid can be pressed into the micro-cavity structures from the opening at the end of the micro-cavity structures by using a vacuum device, and then the micro-cavity structures are sealed. The present embodiment does not limit the method of filling the liquid.

Figure 6B:
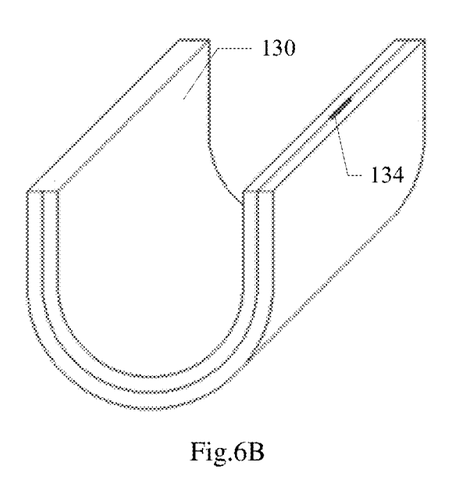
FIG. 6B is a schematic diagram of a heat dissipation structure in a manufacturing process according to another example of an embodiment of the present disclosure.

For example, FIG. 6B is a schematic diagram of a heat dissipation structure in the manufacturing process according to another example of an embodiment of the present disclosure. As shown in FIG. 6B, the heat dissipation plate body 130 includes a substrate, a plurality of grooves extending in a first direction and arranged in a second direction are formed in the substrate (similar to the first grooves 142 as shown in FIG. 2), the first direction and the second direction are crossed to each other; then the substrate is folded in the first direction to bond the plurality of grooves so as to form the plurality of micro-cavity structures; after folding, three sides of the substrate are welded and sealed except for the folded side, and at least one non-welded area is retained at the edge during welding. For example, the example illustrates one opening 134 as an example. However, it is not limited thereto and the non-welded area can have a plurality of openings, and the retained openings 134 are used to subsequently fill the micro-cavity structures with the liquid. The method of filling the liquid in the present example is the same as the above example, and will not be repeated here.

For example, the heat dissipation plate body having the plurality of micro-cavity structures can also be formed by using a 3D printing technology.

For example, the heat dissipation structure is manufactured into the U-shape or the L-shape along the extending direction of the micro-cavity structure, that is, the heat dissipation structure is processed such that the cross section of the heat dissipation structure is the U-shape or the L-shape in the extending direction of the micro-cavity structure. Here, the U-shape and the L-shape refer to the approximate U-shape and L-shape, and the schematic diagram of the present embodiment mainly describes the U-shaped heat dissipation structure as an example. For the L-shaped heat dissipation structure, the heat dissipation principle is similar to the U-shaped heat dissipation structure, and will not be repeated here.

For example, a maximum size of the cross section of each of the micro-cavity structures in a plane perpendicular to the extending direction of the micro-cavity structures is 10 μm-2 mm, and the embodiment includes this but is not limited thereto. The micro-cavity structure provided by the embodiment has a very small aperture diameter, and thus a capillary pulling force can be provided for the condensed liquid in the cavity to enable the condensed liquid to flow from the condensation part back to the evaporation part in time.

For example, the plurality of micro-cavity structures are in communication with each other, that is, adjacent micro-cavity structures are in communication with each other.

For example, an example in which the plurality of micro-cavity structures of the heat dissipation structure are arranged in parallel is illustrated. On the one hand, uniform heat dissipation can be ensured by arranging the plurality of micro-cavity structures in parallel, and on the other hand, in a case that the size of the heat dissipation structure is constant, the evaporation part can be filled with more liquid to achieve an optimum heat dissipation effect. The present embodiment includes this but is not limited thereto, and for example, the plurality of micro-cavity structures can also be arranged in non-parallel. Upon the micro-cavity structures being arranged in non-parallel, in a case that the heat dissipation plate body includes the first substrate and the second substrate, the plurality of micro-cavity structures can be formed by completely bonding the first grooves and the second grooves; in a case that the heat dissipation plate body includes only one substrate, a center line can be provided on the substrate, and then both sides of the center line are processed to form symmetrically distributed grooves, and then the substrate is folded along the center line to ensure to form the plurality of micro-cavity structures by bonding the grooves. For example, the micro-cavity structure produced in the present embodiment can further include a mesh or a sintered structure, and the like, which is not limited in the present embodiment.

For example, the heat dissipation plate body includes an evaporation part and a condensation part, and each of the micro-cavity structures extends from the evaporation part to the condensation part. The evaporation part is filled with the liquid, to absorb heat at the evaporation part to change into vapor, the vapor moves toward the condensation part, and the vapor moved to the condensation part is condensed and liquefied and moves toward the evaporation part to achieve the phase change cycle. On the one hand, the "phase change cycle" herein refers to the evaporation-condensation cycle of the two-phase flow heat dissipation technology, which uses the liquid to absorb the heat at the evaporation part close to the heat source, the liquid changes to vapor, and then the vapor condenses and dissipates heat at the condensation part, to rapidly conduct the heat. Furthermore, the heat transfer efficiency of this technology is higher than that of a general solid material. On the other hand, the "micro-cavity structure" of the present embodiment can refer to a microchannel. The heat dissipation structure is provided with the micro-cavity structure. The tiny space of the micro-cavity structure can provide a capillary pulling force for the liquid, and the capillary pulling force can facilitate to pull back the liquid condensed in the cavity from the condensation part to the evaporation part close to the heat source in time, thereby resisting the thrust of the vapor pressure in the micro-cavity structure, to prevent the evaporation part from generating continuously drying in a large area, so as to improve the performance and efficiency of the heat dissipation structure. Therefore, the heat dissipation structure provided by the embodiment of the present disclosure applied with the two-phase flow heat dissipation technology and the micro-channel heat dissipation technology, can provide a good heat dissipation effect.

For example, the "micro-cavity structure" of the embodiment can also refer to the mesh or the sintered structure, etc., which can also provide the capillary pulling force for the condensed liquid in the cavity to enable the condensed liquid to flow from the condensation part back to the evaporation part in time.

For example, the heat dissipation plate body has a U-shaped cross section along the extending direction of the micro-cavity structures, the evaporation part is disposed at the bent part of the U-shaped cross section, and the condensation part is disposed at the end of the U-shaped cross section (or the heat dissipation plate body has a L-shaped cross section in the extending direction of the micro-cavity structures, the evaporation part is disposed at one end of the L-shaped cross section, and the condensation part is disposed at the other end of the L-shaped cross section).

For example, it is also possible to form a concave part in the surface of the evaporation part for wrapping a heat source such as a chip for a chip-on-film. Therefore, the shape and size of the concave part can be designed according to the shape and size of the heat source. For example, the depth of the concave part may be 0.5-1 mm, and the embodiment includes this, but is not limited thereto.

It should be noted that, as shown in FIG. 2, upon the thickness of the heat source in the Z direction being less than the thickness of the bent part of the heat dissipation plate body 130 (the solid part of the micro-cavity structure facing the heat source side) in the Z direction, the design of the micro-cavity structure will not be effected; upon the thickness of the heat source in the Z direction being not less than the thickness of the bent part of the heat dissipation plate body 130 (the solid part of the micro-cavity structure facing the heat source side) in the Z direction, in order to prevent the liquid in the micro-cavity structure 140 from leakage, the micro-cavity structure 140 is not provided at the heat dissipation plate body 130 where the concave part 131 is provided, and the embodiment includes this but is not limited thereto.

For example, the heat dissipation plate body can have the same material, including materials such as copper, aluminum, graphite, ceramics, and the like, which have good heat dissipation property. The embodiment illustrates an example in which the heat dissipation plate body are made of copper.

For example, the thermal conductivity of the condensation part is higher than that of the evaporation part. For example, in order to achieve a better evaporation and condensation effect, the heat dissipation plate body disposed in the condensation part can be doped with a material having better heat dissipation property, and the embodiment includes this but is not limited thereto. For example, it is also possible to use a material different from the evaporation part in the condensation part, that is, the thermal conductivity of the material used in the condensation part is higher than that of the material used in the evaporation part to achieve a better condensation effect.

The heat dissipation structure of the display device manufactured by the method of manufacturing the heat dissipation structure provided by the embodiment applies the two-phase flow heat dissipation technology and the micro-channel heat dissipation technology to achieve the technical effect of dissipating heat of the chip for the chip-on-film to reduce the temperature of the chip-on-film, thereby solving the problem of excessive heat and high temperature of the chip for the chip-on-film in the large-size display device.

The following statements should be noted:

(1) Unless otherwise defined, in the embodiments and accompanying drawings in the present disclosure, the same reference numeral represents the same meaning.

(2) The accompanying drawings involve only the structure(s) in connection with the embodiment(s) of the present disclosure, and other structure(s) can be referred to common design(s).

(3) For the purpose of clarity, in accompanying drawings for illustrating the embodiment(s) of the present disclosure, layer(s) or region(s) may be enlarged. However, it should understood that, in the case in which a component or element such as a layer, film, region, substrate or the like is referred to be "on" or "under" another component or element, it may be directly on or under the another component or element or a component or element is interposed therebetween.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display device comprising:
a chip-on-film, comprising a chip; and
a heat dissipation structure comprising:
a heat dissipation plate body, comprising an evaporation part and a condensation part, and
a plurality of micro-cavity structures, disposed in the heat dissipation plate body, two ports of each of the plurality of micro-cavity structures being sealed, and the plurality of micro-cavity structures being filled with liquid,
wherein each of the plurality of micro-cavity structures extends from the evaporation part to the condensation part,
wherein the heat dissipation structure is attached to the chip-on-film, and an orthographic projection of the chip on the heat dissipation structure falls into the evaporation part, and
wherein one side of the heat dissipation structure is provided with a concave part, and the side of the heat dissipation structure provided with the concave part is attached to a side of the chip-on-film provided with the chip, and the chip is in the concave part;
the heat dissipation structure has a U-shaped or L-shaped cross section along an extending direction of the plurality of micro-cavity structures, a shape of a cross section of the chip-on-film along the extending direction of the plurality of micro-cavity structures is the same as that of the cross section of the heat dissipation structure along the extending direction of the plurality of micro-cavity structures.

2. The display device according to claim 1, wherein a thermal silicone grease is provided between the heat dissipation structure and the chip-on-film.

3. A method of manufacturing the heat dissipation structure of the display device according to claim 1, comprising:
forming the heat dissipation plate body having the plurality of micro-cavity structures;
filling the plurality of micro-cavity structures with the liquid,
wherein the heat dissipation plate body comprises the evaporation part and the condensation part, each of the plurality of micro-cavity structures extends from the evaporation part to the condensation part, and after the liquid absorbs heat at the evaporation part to change into vapor, the vapor moves toward the condensation part, and the vapor moved to the condensation part is condensed and liquefied and moves toward the evaporation part to achieve heat dissipation;
the method further comprising: processing the heat dissipating structure so that the heat dissipation structure has a U-shaped or L-shaped cross section along an extending direction of the plurality of micro-cavity structures, wherein a shape of a cross section of the chip-on-film along the extending direction of the plurality of micro-cavity structures is the same as that of the cross section of the heat dissipation structure along the extending direction of the plurality of micro-cavity structures.

4. The method of manufacturing the heat dissipation structure according to claim 3, wherein the heat dissipation plate body comprises a first substrate and a second substrate, and forming the heat dissipation plate body having the plurality of micro-cavity structures comprises:
forming a plurality of first grooves in the first substrate;
forming a plurality of second grooves in the second substrate;
attaching a side of the first substrate provided with the first grooves to a side of the second substrate provided with the second grooves to form the heat dissipation plate body having the plurality of micro-cavity structures,
wherein an orthographic projection of the plurality of first grooves on the second substrate completely coincides with an orthographic projection of the plurality of second grooves on the second substrate, so that the plurality of first grooves are bonded to the plurality of second grooves in one-to-one correspondence to form the plurality of micro-cavity structures.

5. The method of manufacturing the heat dissipation structure according to claim 3, wherein forming the heat dissipation plate body having the plurality of micro-cavity structures comprises:
providing a substrate;
presetting a center line on the substrate, and symmetrically processing both sides of the center line to form a plurality of grooves symmetrically distributed on the both sides of the center line;
folding the substrate along the center line to form the heat dissipation plate body having the plurality of micro-cavity structures,
wherein the substrate is folded along the center line to bond the plurality of grooves completely to form the plurality of micro-cavity structures.

6. The method of manufacturing the heat dissipation structure according to claim 3, wherein the heat dissipation plate body having the plurality of micro-cavity structures is formed by using a 3D printing technique.

7. The method of manufacturing the heat dissipation structure according to claim 4, wherein after forming the plurality of micro-cavity structures, sealing periphery edges of the heat dissipation plate body, and in the sealing, at least one unsealed region is retained at an edge where the plurality of micro-cavity structures extend to the heat dissipation plate body so as to fill the plurality of micro-cavity structures with the liquid, and sealing the unsealed region after filling the liquid.

8. The display device according to claim 1, wherein a thermal conductivity of the condensation part is higher than that of the evaporation part.

9. The display device according to claim 1, wherein the heat dissipation plate body comprises a first substrate and a second substrate, and the first substrate and the second substrate are attached and sealed to each other, so that the plurality of micro-cavity structures are formed between the first substrate and the second substrate.

10. The display device according to claim 1, wherein a region of the plurality of micro-cavity structures which is not filled with the liquid comprises a negative pressure region.

11. The display device according to claim 1, wherein the plurality of micro-cavity structures are in communication with each other.

12. The display device according to claim 1, wherein a maximum size of a cross section of each of the plurality of micro-cavity structures in a plane perpendicular to an extending direction of the plurality of micro-cavity structures is 10 μm-2 mm.

* * * * *